(12) United States Patent
Minamio et al.

(10) Patent No.: US 8,471,373 B2
(45) Date of Patent: Jun. 25, 2013

(54) RESIN-SEALED SEMICONDUCTOR DEVICE AND METHOD FOR FABRICATING THE SAME

(75) Inventors: Masanori Minamio, Osaka (JP); Shinichi Ijima, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/382,244

(22) PCT Filed: Jun. 3, 2011

(86) PCT No.: PCT/JP2011/003135
§ 371 (c)(1),
(2), (4) Date: Jan. 4, 2012

(87) PCT Pub. No.: WO2011/155165
PCT Pub. Date: Dec. 15, 2011

(65) Prior Publication Data
US 2012/0112332 A1 May 10, 2012

(30) Foreign Application Priority Data
Jun. 11, 2010 (JP) ................................. 2010-133638

(51) Int. Cl.
*H01L 23/495* (2006.01)
*H01L 23/28* (2006.01)
*H01L 21/00* (2006.01)

(52) U.S. Cl.
USPC ............. 257/676; 257/787; 257/E21.499; 257/E21.502; 257/E21.503; 257/E21.506; 257/E23.031; 257/E23.039; 257/E23.116; 438/123; 438/124

(58) Field of Classification Search
USPC ............ 257/676, 787, E21.499, E21.502, 257/E21.503, E21.506, E23.031, E23.039, 257/E23.116; 438/123, 124
See application file for complete search history.

(56) References Cited

U.S. PATENT DOCUMENTS 6,037,187 A * 3/2000 Mizuuchi ...................... 438/25
6,313,520 B1 * 11/2001 Yoshida et al. ............... 257/676
(Continued)

FOREIGN PATENT DOCUMENTS

| JP | 11-307721 A | 11/1999 |
| JP | 2001-250911 A | 9/2001 |

(Continued)

OTHER PUBLICATIONS

International Search Report issued in International Patent Application No. PCT/JP2011/003135, dated Aug. 30, 2011.

*Primary Examiner* — Ida M Soward
(74) *Attorney, Agent, or Firm* — McDermott Will & Emery LLP

(57) ABSTRACT

A resin-sealed semiconductor device includes a power element (1), a control element (4), a first lead frame (3) having a first die pad (3A) which holds the power element (1), a second lead frame (5) having a second die pad (5A) which holds the control element (4), and a housing (6) made of a resin material and sealing the power element, the first die pad, the control element, and the second die pad. A lower surface of the second die pad is higher than an upper surface of the first element, and at least part of the first die pad and at least part of the second die pad overlap each other when viewed from the top. One of the first leads and one of the second leads are directly joined together by a joint portion (23) and electrically coupled together in the housing.

18 Claims, 10 Drawing Sheets

U.S. PATENT DOCUMENTS

| | | | |
|---|---|---|---|
| 6,396,129 B1 * | 5/2002 | Hung et al. | 257/666 |
| 6,518,653 B1 * | 2/2003 | Takagi | 257/677 |
| 6,677,665 B2 * | 1/2004 | Huang | 257/676 |
| 6,791,167 B2 * | 9/2004 | Hayashi et al. | 257/667 |
| 6,965,154 B2 * | 11/2005 | Abe et al. | 257/506 |
| 7,057,273 B2 * | 6/2006 | Harnden et al. | 257/696 |
| 7,250,672 B2 * | 7/2007 | Pavier et al. | 257/691 |
| 7,352,058 B2 * | 4/2008 | Wallace | 257/686 |
| 7,358,535 B2 * | 4/2008 | Shoji et al. | 257/81 |
| 7,476,962 B2 * | 1/2009 | Kim | 257/686 |
| 7,525,183 B2 * | 4/2009 | O'Shea et al. | 257/676 |
| 7,642,638 B2 * | 1/2010 | Kuah et al. | 257/686 |
| 7,714,455 B2 * | 5/2010 | Son et al. | 257/787 |
| 7,791,178 B2 * | 9/2010 | Bang et al. | 257/666 |
| 7,829,995 B2 * | 11/2010 | Matsumura | 257/686 |
| 8,022,522 B1 * | 9/2011 | Liou et al. | 257/686 |
| 2009/0127681 A1 * | 5/2009 | Son et al. | 257/675 |
| 2010/0149773 A1 * | 6/2010 | Said | 361/783 |
| 2011/0221008 A1 * | 9/2011 | Lu et al. | 257/391 |

FOREIGN PATENT DOCUMENTS

| | | |
|---|---|---|
| JP | 2005-150209 A | 6/2005 |
| JP | 2005-150595 A | 6/2005 |
| JP | 2008-300671 A | 12/2008 |
| JP | 2008-300672 A | 12/2008 |

* cited by examiner

RESIN-SEALED SEMICONDUCTOR DEVICE AND METHOD FOR FABRICATING THE SAME

RELATED APPLICATIONS

This application is the U.S. National Phase under 35 U.S.C. §371 of International Application No. PCT/JP2011/003135, filed on Jun. 3, 2011, which in turn claims the benefit of Japanese Application No. 2010-133638, filed on Jun. 11, 2010, the disclosures of which Applications are incorporated by reference herein.

TECHNICAL FIELD

A technique disclosed herein relates to a resin-sealed semiconductor device and a method for fabricating the resin-sealed semiconductor device.

BACKGROUND ART

In recent years, an increasing demand for further reduction in size and weight of, for example, inverter control equipments has arisen. To meet the demand, there have been efforts to reduce the size and weight of resin-sealed semiconductor devices (power modules) provided in inverter control equipments.

Specifically, a first lead frame in which a power element is provided, and a second lead frame in which a control element which controls the power element is provided are arranged three-dimensionally and sealed in a housing made of a resin material. With this configuration, the size and weight of resin-sealed semiconductor devices are reduced (see, for example, PATENT DOCUMENT 1).

A conventional resin-sealed semiconductor device of the PATENT DOCUMENT 1 has a configuration in which a power chip and a control chip which controls the power chip are directly coupled together via a wiring without a pad interposed therebetween, and furthermore, are sealed with a molding resin material. Die pads are three-dimensionally arranged so that a die pad of a lead which holds the control chip is located higher than a die pad of a lead which holds the power chip. Thus, reduction in the length of the wiring is achieved.

Accordingly, the power chip and the control chip are directly coupled together via the wiring, thus increasing reliability. Furthermore, both of the die pads are arranged so that end portions thereof overlap each other when viewed from the top (in a planar view), thus resulting in reduction in size of the resin-sealed semiconductor device.

CITATION LIST

Patent Document

PATENT DOCUMENT 1: Japanese Patent Publication No. 2005-150595

SUMMARY OF THE INVENTION

Technical Problem

Incidentally, to further reduce the size of the above-described resin-sealed semiconductor device, the control chip and the power chip which are three-dimensionally arranged have to overlap each other when viewed from the top.

However, the control chip and the power chip are arranged to overlap each other when viewed from the top, the control chip and the power chip cannot be coupled together directly via a wiring. That is, when a resin-sealed semiconductor device is formed to have the conventional configuration, the size of the resin-sealed semiconductor device cannot be further reduced.

It is therefore, an object of the present disclosure to solve the above-described problem, and further reduce the size of semiconductor devices by employing a three-dimensional configuration in a resin-sealed semiconductor device in which a plurality of chips are sealed and a method for fabricating the resin-sealed semiconductor device.

Solution to the Problem

To achieve the above-described object, a resin-sealed semiconductor device according to the present invention includes: a first element; a second element; a first lead frame having a first die pad which holds the first element on an upper surface thereof, and a plurality of first leads; a second lead frame having a second die pad which holds the second element on an upper surface thereof, and a plurality of second leads; and a housing made of a resin material and sealing the first element, the first die pad, and at least part of each of the first leads, and the second element, the second die pad, and at least part of each of the second leads, and one or more of the first leads and one or more of the second leads are directly joined together by a first joint portion and electrically coupled together in the housing Also, to achieve the above-described object, a method for fabricating a resin-sealed semiconductor device according to the present invention includes: after forming a first raised portion at one of a plurality of first leads in a first lead frame, and a first hole portion at one of a plurality of second leads in a second lead frame in advance; placing the first lead frame in a lower mold; placing the second lead frame on the first frame so that the first raised portion is fitted in the first hole portion; applying a weight to the first raised portion fitted in the first hole portion by an insert pin provided in an upper mold to directly join the first lead and the second lead together; and injecting a sealing material between the lower mold and the upper mold to form a housing made of the sealing material.

Advantages of the Invention

A resin-sealed semiconductor device and a method for fabricating the resin-sealed semiconductor device according to the present invention may allow further reduction in size of semiconductor devices while employing a three-dimensional configuration.

DESCRIPTION OF EMBODIMENTS

Figure 1:
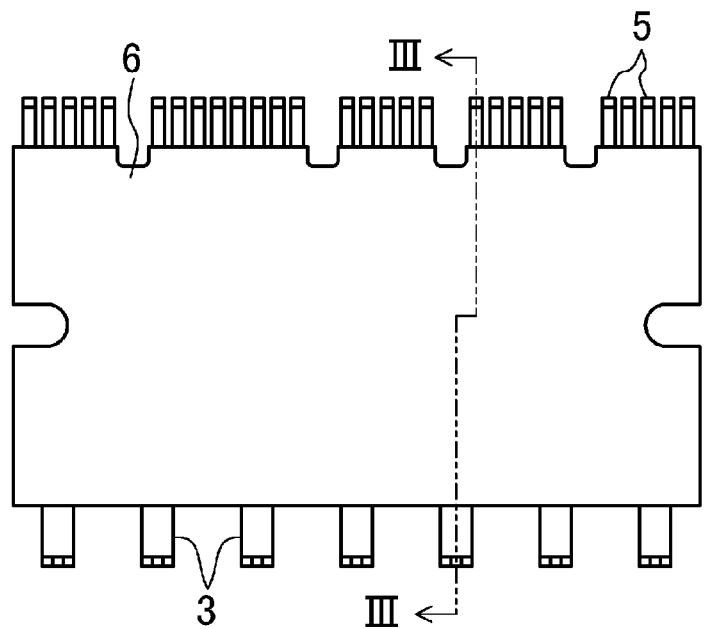
FIG. 1 is a plan view illustrating a resin-sealed semiconductor device according to a first embodiment.
Figure 2:
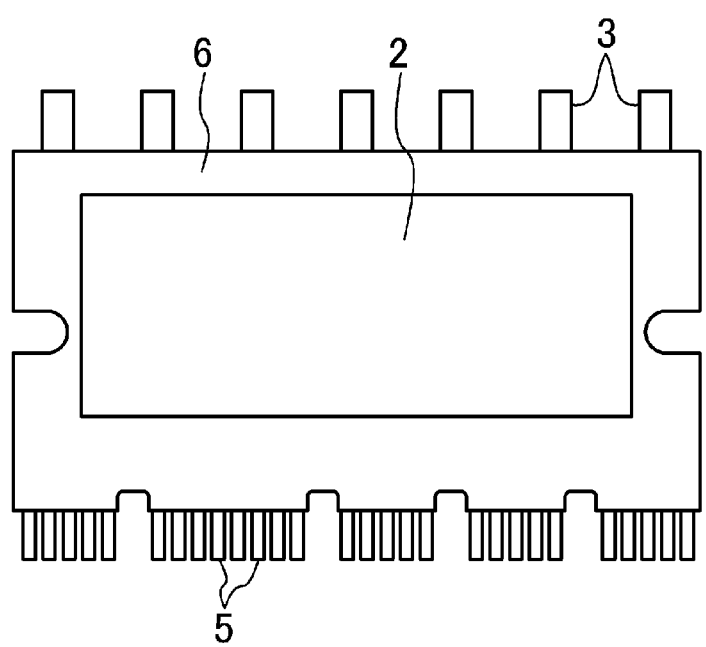
FIG. 2 is a bottom view illustrating the resin-sealed semiconductor device of the first embodiment.

Example embodiments will be described below with reference to the accompanying drawings. Note that the present invention is not limited to the description provided below as long as it is based on basic features described in this specification.

First Embodiment

A first embodiment will be described with reference to FIGS. 1-5.

As shown in FIGS. 1-5, a resin-sealed semiconductor device according to this embodiment includes a first lead frame 3 which holds a power element 1, which is a first element, above a first die pad 3A, a second lead frame 5 which holds a control element 4, which is a second element, above a second die pad 5A, a heat radiating plate 2 fixed to a lower surface of the first lead frame 3 with an insulating sheet 10 interposed therebetween, and a housing 6 made of a sealing resin material.

The housing 6 is formed so that the housing 6 covers one of end portions of the first lead frame 3 including the power element 1, and one of end portions of the second lead frame 5 including the control element 4, and a lower surface of the heat radiating plate 2 is exposed.

Figure 3:
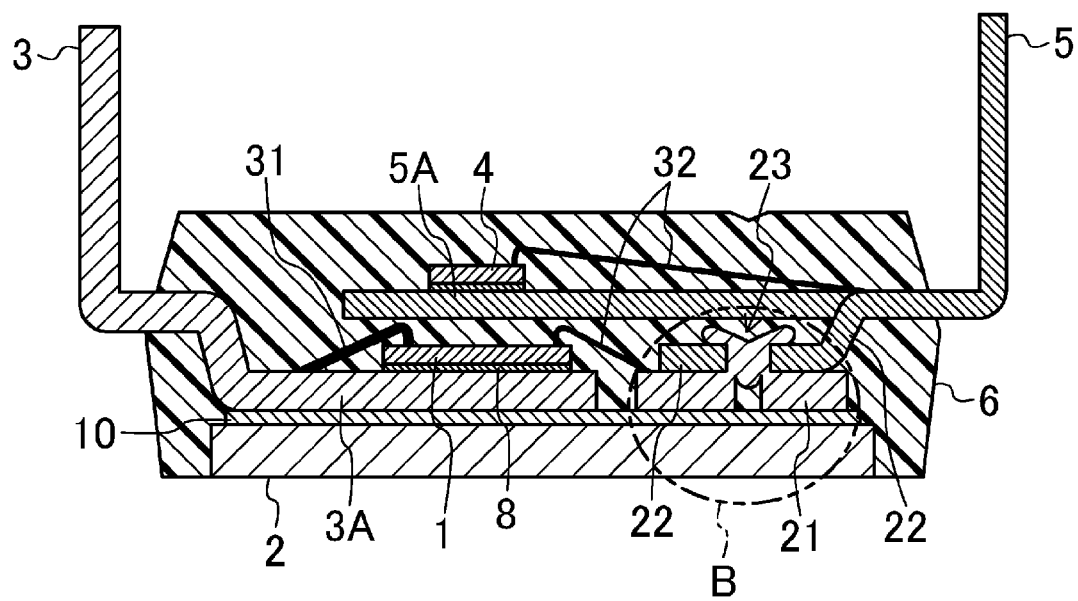
FIG. 3 is a cross-sectional view taken along the line III-III of FIG. 1.
Figure 5:
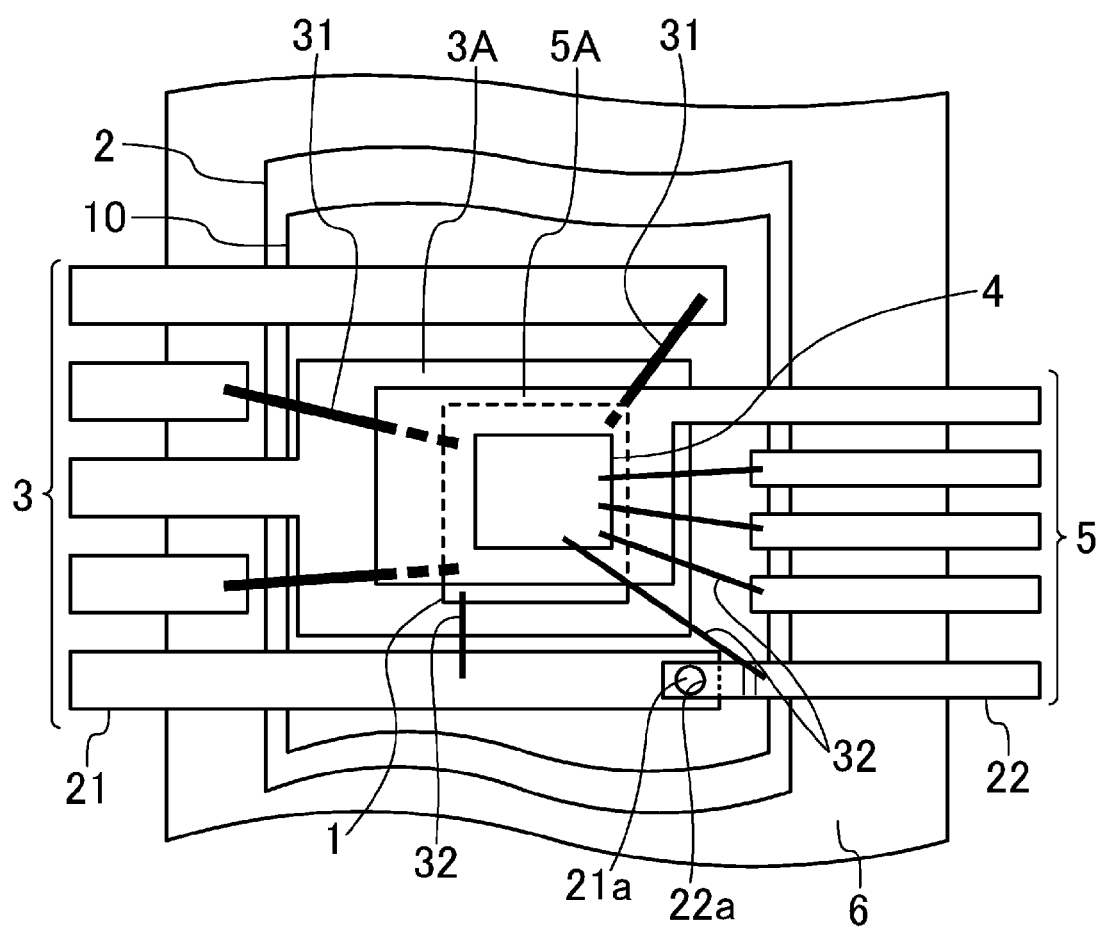
FIG. 5 is a plan view illustrating an internal configuration in the resin-sealed semiconductor device of the first embodiment.

As shown in FIG. 3 and FIG. 5, at least parts of the first die pad 3A and the second die pad 5A overlap each other when viewed from the top, for the purpose of reducing the size of the resin-sealed semiconductor device. Furthermore, at least parts of the power element 1 and the control element 4 are arranged to overlap each other when viewed from the top.

Therefore, in this embodiment, the power element 1 and the control element 4 cannot be coupled directly via a wiring 32 made of, for example, gold (Au). Thus, the resin-sealed semiconductor device of this embodiment is configured so that, in the first lead frame 3, one of a plurality of leads serves as a power element junction lead 21. Also, in the second lead frame 5, one of a plurality of leads serves as a control element junction lead 22. Respective end parts of the power element junction lead 21 and the control element junction lead 22 are joined together by a joint portion 23 (a first joint portion).

Note that in FIG. 5, the power element 1 and the control element 4 are in one-to-one correspondence and paired together. Although not shown in the drawings, the resin-sealed semiconductor device of this embodiment has a configuration including two or more pairs of the power elements 1 and the control elements 4. However, when the resin-sealed semiconductor device has a configuration including only one pair of the power element 1 and the control element 4, the present invention is effective. Needless to say, the pair of elements is not limited to the combination of a power element and a control element.

Details of the resin-sealed semiconductor device of this embodiment will be described below.

As shown in FIG. 5, the first lead frame 3 is made of metal such as, for example, copper (Cu), etc. having high conductivity. The first lead frame 3 includes a plurality of leads as well as the first die pad 3A.

As the power element 1, for example, an IGBT (insulated gate bipolar transistor) or a power MOSFET (metal-oxide-semiconductor field effect transistor) can be used.

As shown in FIG. 3, the power element 1 is fixed to an upper surface of the first die pad 3A of the first lead frame 3 with a brazing material 8. As shown in FIG. 3 and FIG. 5, boding pads (not shown) in the power element 1 and the plurality of leads of the first lead frame 3 are mutually and electrically coupled via wirings 31. For the wirings 31, for example, aluminum (Al) can be used. Also, instead of wirings, ribbons made of Al or clips made of copper (Cu) may be used as the wirings 31. Using ribbons made of Al and clips made of copper (Cu), a large cross-sectional area can be provided, as compared to wirings, so that the wiring resistance value can be reduced, and power loss can be reduced.

As the heat radiating plate 2, for example, a metal such as copper (Cu) or aluminum (Al), etc. having high heat conductivity can be used. The insulating sheet 10 provided between the heat radiating plate 2 and the first die pad 3A is made of an insulating material having heat conductivity. For example, the insulating sheet 10 has a three-layer configuration in which an insulating layer is sandwiched between adhesion layers. The insulating sheet 10 gives electrical isolation between the heat radiating plate 2 and the first die pad 3A, as well as allows effective transmission of heat generated by the power element 1 to the heat radiating plate 2.

As shown in FIG. 3 and FIG. 5, for example, the second lead frame 5 is made of a metal such as copper (Cu) or 42 alloy (Fe-42% Ni), etc. having high conductivity. The second lead frame 5 includes a plurality of leads as well as the second die pad 5A.

The control element 4 is an element (chip) which controls the power element 1, and includes a drive circuit and an excessive current preventing circuit, etc. The control element 4 is fixed to an upper surface of the second die pad 5A of the second lead frame 5, for example, with a silver (Ag) paste material. The boding pads (not shown) in the control element 4 and the plurality of leads of the second lead frame 5 are mutually and electrically coupled via wirings 32 made of gold (Au).

As shown in FIG. 3, the second die pad 5A which holds the control element 4 is arranged substantially parallel to an upper surface of the power element 1 to be spaced from an upper portion of the power element 1. The second die pad 5A covers at least part of each of the wirings 31 coupled to the power element 1. Thus, the second die pad 5A is arranged between the wirings 31 coupled the power element 1 and the control element 4 in a direction vertical to the upper surface of the power element 1 (when viewed from the top). Therefore, at least part of electromagnetic wave noise generated by the wirings 31 serving as output signal lines of the power element 1 and propagating to the control element 4 can be shielded by the second die pad 5A. As a result, malfunction of the control element 4 due to electromagnetic wave noise can be prevented or reduced.

Note that a plated layer may be formed on at least part of the second die pad 5A, specifically, on a lower surface of the second die pad 5A using a magnetic material such as nickel (Ni), etc. When a plated layer is formed in this manner, electromagnetic wave noise generated from the power element 1 can be absorbed by the plated layer. Therefore, influences of electromagnetic wave noise on the control element 4 can be further reduced by forming the plated layer.

Incidentally, the control element 4 has to be electrically coupled to the power element 1 to control the power element 1. However, in this embodiment, the second die pad 5A which holds the control element 4 is three-dimensionally arranged above the power element 1. Thus, it is difficult to directly couple a bonding pad (which will be hereinafter referred to as a "power element electrode") of the power element 1, for receiving a signal from the control element 4 to a bonding pad (which will be hereinafter refereed to as a "control element electrode") of the control element 4, for outputting a signal to the power element 1 via a wiring, etc. When the elements are three-dimensionally arranged, to couple the power element 1 and the control element 4 together via a wiring, the power element electrode and the control element electrode have to be coupled together via an additional junction member. Using such a joining method, the configuration of the resin-sealed semiconductor device becomes unstable and complex, and reliability of wiring coupling cannot be ensured.

Figure 4:
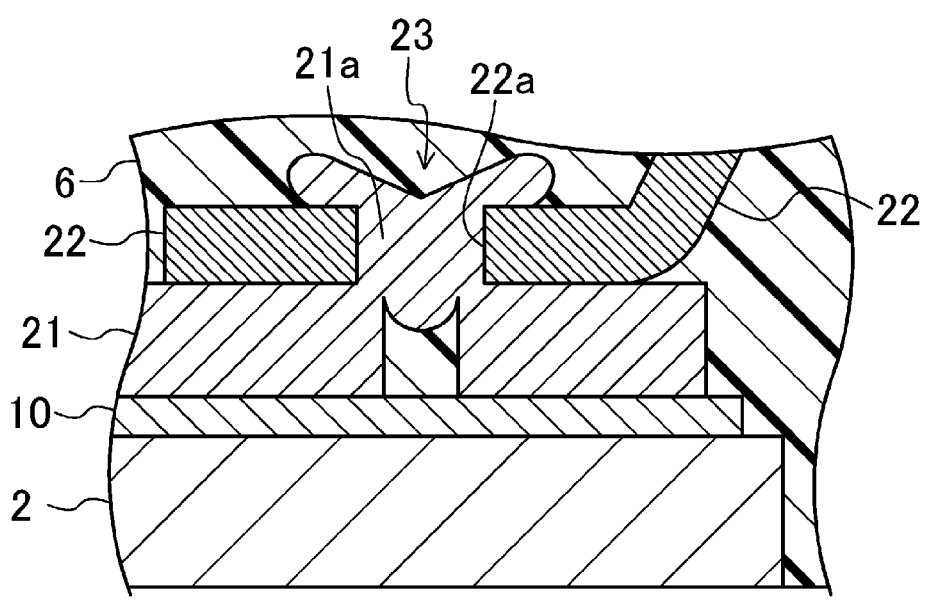
FIG. 4 is a partially enlarged cross-sectional view illustrating a region B of FIG. 3.

Therefore, as shown in FIGS. 3-5, in this embodiment, the power element junction lead 21 is provided in the first lead frame 3, the control element junction lead 22 is provided in the second lead frame 5, and the power element junction lead 21 and the control element junction lead 22 are coupled together by the joint portion 23. In this embodiment, this joint of the leads provides electrical coupling of the power element 1 and the control element 4.

Specifically, the power element electrode and the power element junction lead 21, which is one of the plurality of leads of the first lead frame 3 are electrically coupled together by the wiring 32. As shown in FIG. 4, the power element junction lead 21 is configured so that an end portion thereof is bent, and includes a raised portion 21a (a first raised portion) whose upper surface protrudes. For example, a metal plated layer is formed on a surface of the raised portion 21a using a metal such as nickel (Ni) or gold (Au), etc. having low contact resistance. The power element junction lead 21 is fixed to an upper surface of the heat radiating plate 2 with the insulating sheet 10 interposed therebetween.

On the other hand, the control element electrode and the control element junction lead 22, which is one of the plurality of leads of the second lead frame 5 are electrically coupled together by the wiring 32. A hole portion 22a (a first hole portion) is formed at an end portion of the control element junction lead 22. For example, a metal plated layer is formed at a peripheral portion of the hole portion 22a in an internal walls and an upper surface thereof using a metal such as nickel (Ni) or gold (Au), etc. having low contact resistance.

In this case, as shown in FIG. 4, the raised portion 21a of the power element junction lead 21 is fitted in the hole portion 22a of the control element junction lead 22, and a top portion of the raised portion 21a is squashed outwardly from the peripheral portion of the hole portion 22a. The squashed portion of the raised portion 21a and the hole portion 22a together form the joint portion 23. That is, the joint portion 23 of the power element junction lead 21 and the control element junction lead 22 is made of caulking press by application of pressing force.

A metal plated layer such as an Ni plated layer, etc. having low contact resistance is formed on the surface of the raised portion 21a of the power element junction lead 21 and the peripheral portion of the hole portion 22a of the control element junction lead 22 in the internal walls and upper surface thereof Thus, the power element junction lead 21 and the control element junction lead 22 are reliably coupled together not only mechanically but also electrically. With this configuration, the power element 1 and the control element 4 are mutually and electrically coupled via the wiring 32, the power element junction lead 21, and the control element junction lead 22.

As described above, according to this embodiment, even when the first die pad and the second die pad are arranged to form a three-dimensional configuration, i.e., to overlap each other when viewed from the top, and the first element and the second element cannot be coupled together via a wiring, the first element and the second element are electrically coupled together by the first joint portion at which one of the plurality of first leads and one of the second leads are directly coupled together in the housing. Thus, the size of the resin-sealed semiconductor device can be sufficiently reduced to an extent that the first element and the second element cannot be coupled together by a wiring.

Note that the hole portion 22a provided in the control element junction lead 22 is preferably formed by stamping in a direction from the bottom to the top using a press. This is because when the hole portion 22a is formed by stamping in this direction, an outer edge portion of the hole portion 22a at its lower surface is rounded, and no burr is formed at part outwardly extending from the lower surface of the hole portion 22a, so that the raised portion 21a of the power element junction lead 21 can be easily fitted in the hole portion 22a.

A coupling distance of the wiring 31 which couples the power element electrode and the power element junction lead 21 and a coupling distance of the wiring 32 which couples the control element electrode and the control element junction lead 22 are preferably as short as possible. With a reduced coupling distance of the wiring 32, a gate loop length between the power element 1 and the control element 4 can be made small. Thus, an inductance (L) value is reduced, and influences of noise can be reduced. As a result, malfunction of the control element 4 can be prevented or reduced.

The housing 6 is made of, for example, a heat hardening resin material (a sealing resin material) such as epoxy, etc. The housing 6 covers the power element 1, the first die pad 3A, at least part (for example, an end portion) of the first lead frame 3 including the power element junction lead 21, the control element 4, the second die pad 5A, at least part (for example, an end portion) of the second lead frame 5 including the control element junction lead 22, and side surfaces of the heat radiating plate 2. By forming the housing 6 covering the above-described members, the first lead frame 3 and the second lead frame 5 can be united together by the housing 6, and also the power element 1 and the control element 4 are protected by the housing 6.

As describes above, the lower surface of the heat radiating plate 2 made of copper or aluminum is exposed from the lower surface of the housing 6. Thus, heat generated from the power element 1 can be efficiently transferred to the outside. The side surfaces of the heat radiating plate 2 are covered by the housing 6, and thus, a strong joint of the heat radiating plate 2 and the first lead frame 3 is provided.

The other end portion of each of the first lead frame 3 and the second lead frame 5 exposed from the housing 6 is coupled as a mounting terminal of the resin-sealed semiconductor device to a circuit such as an inverter control equipment, etc.

The other end of each of the power element junction lead 21 and the control element junction lead 22 is exposed from the housing 6, and thus, a coupling state between the power element junction lead 21 and the control element junction lead 22 can be tested externally.

A punch hole (through hole) may be formed by punching in the second die pad 5A. The sealing resin material forming the housing 6 is filled in the punch hole, and thus, the second lead frame 5 is coupled more strongly with the housing 6.

Fabrication Method

A method for fabricating a resin-sealed semiconductor device according to this embodiment will be described below with reference to FIGS. 6-13.

First, a raised portion 21a is formed at an internal (die pad side) end portion of the power element junction lead 21 of the plurality of leads forming the first lead frame 3 for holding the power element 1, for example, by bending work. Subsequently, the power element 1 is fixed to the first die pad 3A of the first lead frame 3 with the brazing material 8. Thereafter, the plurality of leads including the power element junction lead 21 in the first lead frame 3 are respectively coupled to power element electrodes of the power element 1 via wirings 31 and 32.

On the other hand, a hole portion 22a is formed at an internal (die pad side) end portion of the control element junction lead 22 of the plurality of leads forming the second lead frame 5 for holding the control element 4, for example, by press work. Subsequently, the control element 4 is fixed to the second die pad 5A of the second lead frame 5 with a silver paste material. Thereafter, the plurality of leads including the control element junction lead 22 are respectively coupled to control element electrodes of the control element 4 via wirings 32.

Figure 6:
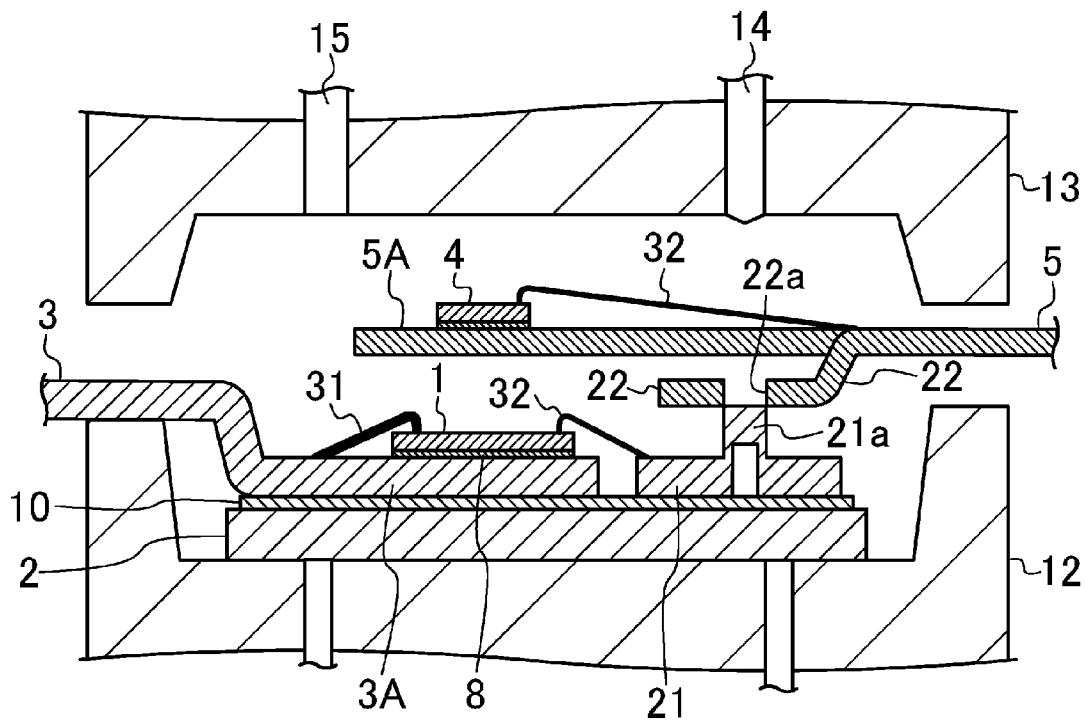
FIG. 6 is a cross-sectional view illustrating a step of a method for fabricating a resin-sealed semiconductor device according to the first embodiment.

Next, as shown in FIG. 6, between the upper mold 13 and the lower mold 12, the heat radiating plate 2 to which the insulating sheet 10 is temporarily bonded is placed on the lower mold 12 with the insulating sheet 10 up. Subsequently, the first lead frame 3 is placed on the lower mold 12 so that each of a lower surface of the first die pad 3A of the first lead frame 3 and a lower surface of the power element junction lead 21 contacts the insulating sheet 10. Thereafter, the second lead frame 5 is placed on the first lead frame 3 so that the hole portion 22a of the control element junction lead 22 in the second lead frame 5 and the raised portion 21a of the power element junction lead 21 in the first lead frame 3 are opposed to each other.

Figure 7:
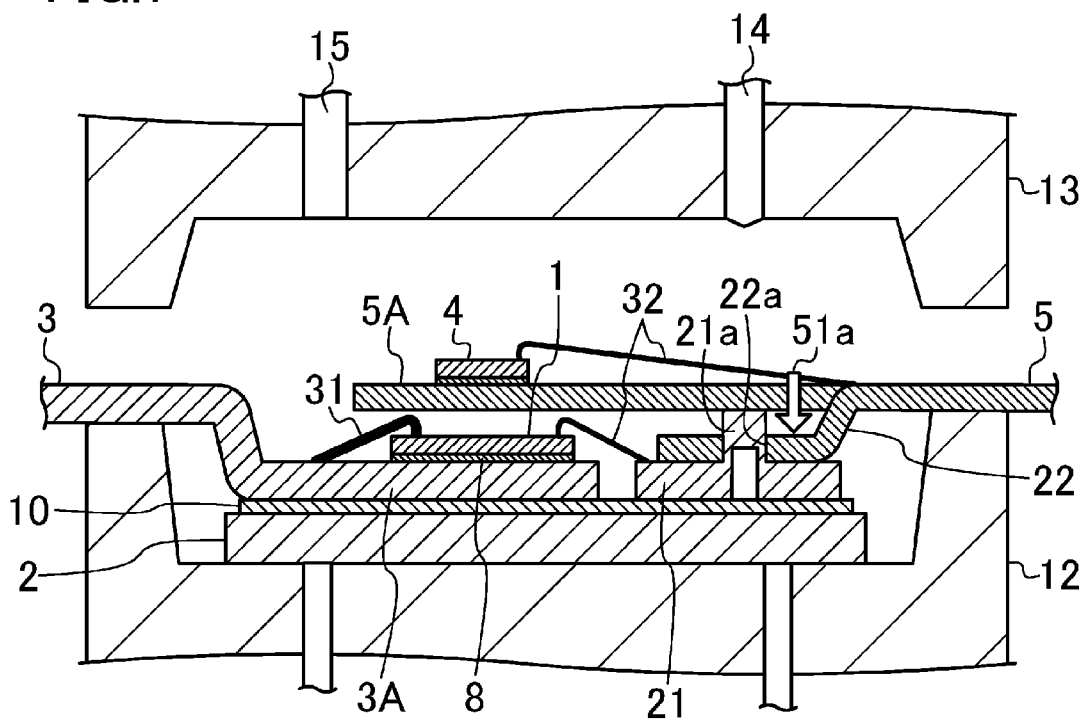
FIG. 7 is a cross-sectional view illustrating a step of the method for fabricating a resin-sealed semiconductor device according to the first embodiment.

Next, the second lead frame 5 is pressed down in a direction along an arrow 51a in FIG. 7 to fit the raised portion 21a of the power element junction lead 21 in the hole portion 22a of the control element junction lead 22.

Note that the respective thicknesses of the power element junction lead 21 and the first lead frame 3 which holds the power element 1 are preferably greater than those of the control element junction lead 22 and the second lead frame 5 which holds the control element 4. Thus, the strength of the raised portion 21a formed by stamping using a press can be increased, and stable fitting of the raised portion 21a in the hole portion 22a can be achieved. Moreover, a top portion of the raised portion 21a of the power element junction lead 21 can be reliably caused to protrude from the hole portion 22a of the control element junction lead 22.

Figure 8:
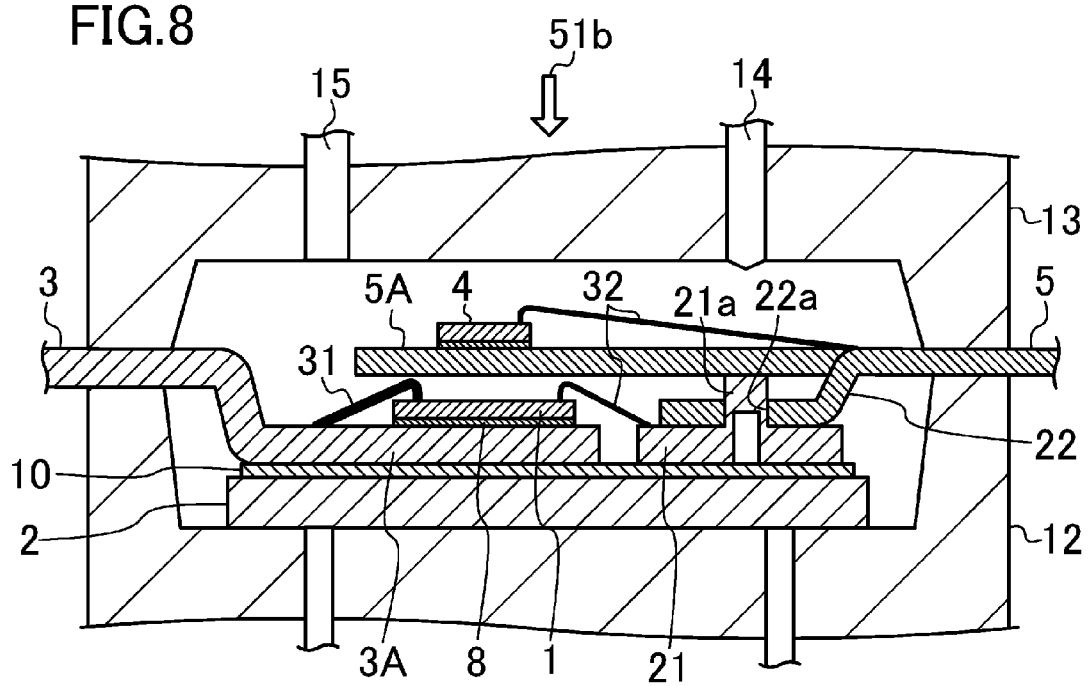
FIG. 8 is a cross-sectional view illustrating a step of a method for fabricating a resin-sealed semiconductor device according to the first embodiment.

Next, the upper mold 13 is moved in a direction shown by an arrow 51b in FIG. 8 toward the lower mold 12 to clamp the first lead frame 3 and the second lead frame 5 by the upper mold 13 and the lower mold 12. In this case, a first mold insert pin 14 is arranged in the upper mold 13 to be opposed to the raised portion 21a of the power element junction lead 21. Also, a second mold insert pin 15 is arranged therein to be opposed to part of the first die pad 3A.

Figure 9:
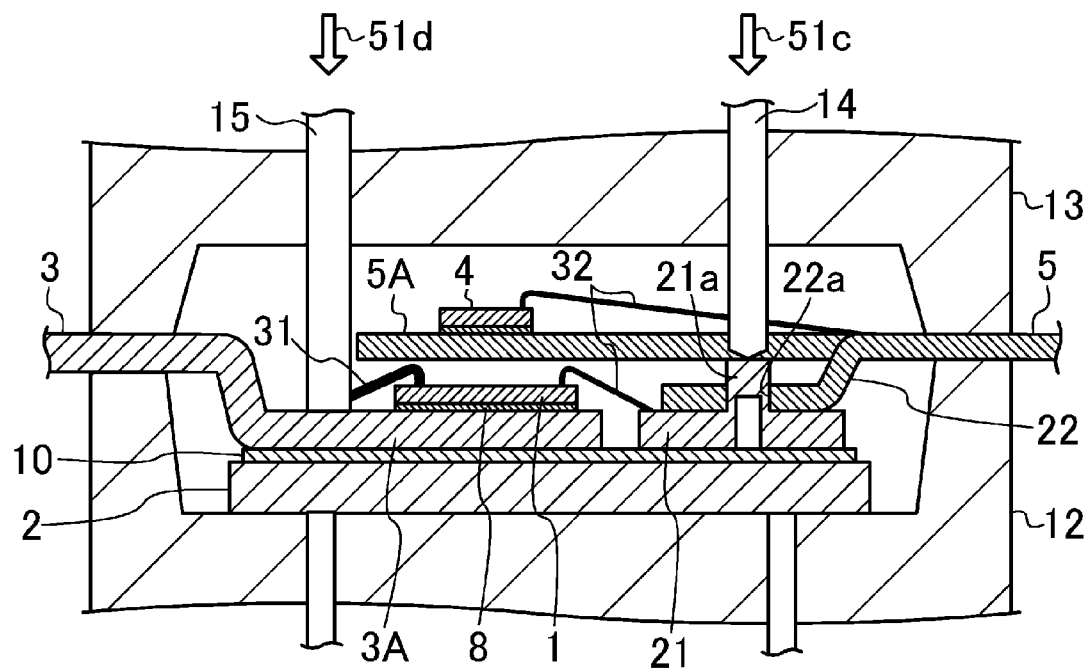
FIG. 9 is a cross-sectional view illustrating a step of the method for fabricating a resin-sealed semiconductor device according to the first embodiment.

Next, the first mold insert pin 14 is moved downward in a direction shown by an arrow 51c in FIG. 9 to press downward a top surface of the raised portion 21a of the power element junction lead 21 which protrudes from the hole portion 22a of the control element junction lead 22. At the same time, the second mold insert pin 15 is moved downward in a direction shown by an arrow 51d in FIG. 9 to press an upper surface of the first die pad 3A downward. In this case, the insulating sheet 10 is bonded to each of a lower surface of the first die pad 3A in the first lead frame 3 and a lower surface of the power element junction lead 21. Thus, when being pressed by each of the first mold insert pin 14 and the second mold insert pin 15, the insulating sheet 10 is deformed to absorb variations in thickness of the first die pad 3A in the first lead frame 3 and height of the raised portion 21a of the power element junction lead 21.

Figure 10:
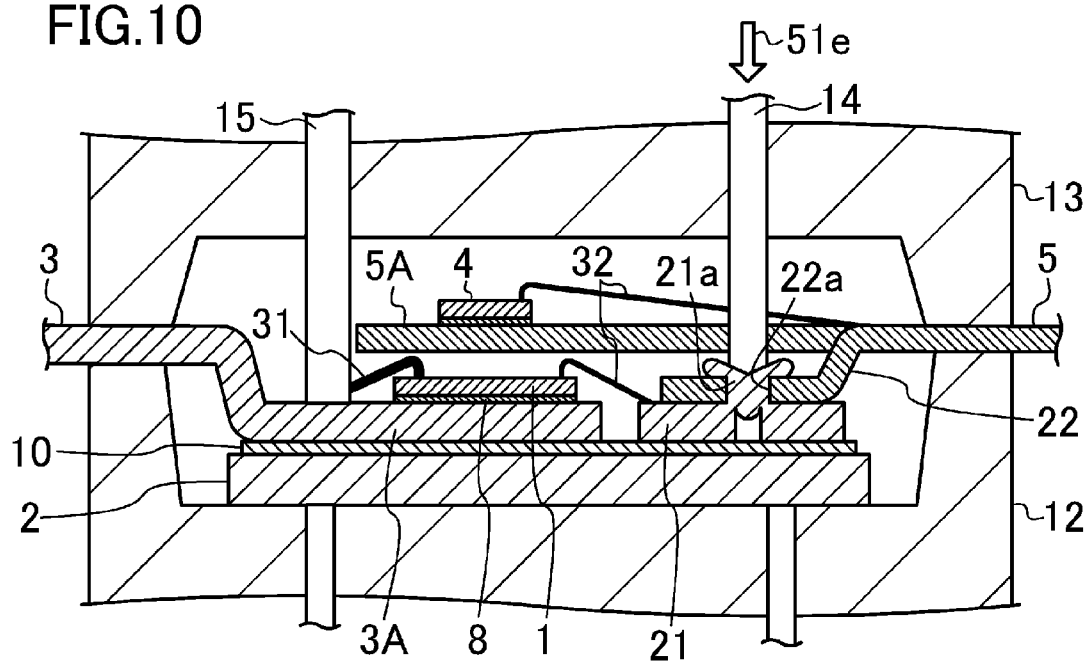
FIG. 10 is a cross-sectional view illustrating a step of the method for fabricating a resin-sealed semiconductor device according to the first embodiment.

Furthermore, the first mold insert pin 14 is moved downward in a direction shown by an arrow 51e in FIG. 10, thereby squashing the top portion of the raised portion 21a of the power element junction lead 21 which protrudes from the hole portion 22a of the control element junction lead 22. In this case, a tip of the first mold insert pin 14 has a circular cone shape with its apex located at a bottom end. Since the first mold insert pin 14 has a circular cone shape, the surface of the squashed top portion of the raised portion 21a of the power element junction lead 21 is deformed to extend around the peripheral of the upper surface of the hole portion 22a of the control element junction lead 22, as shown in FIG. 4.

Figure 11:
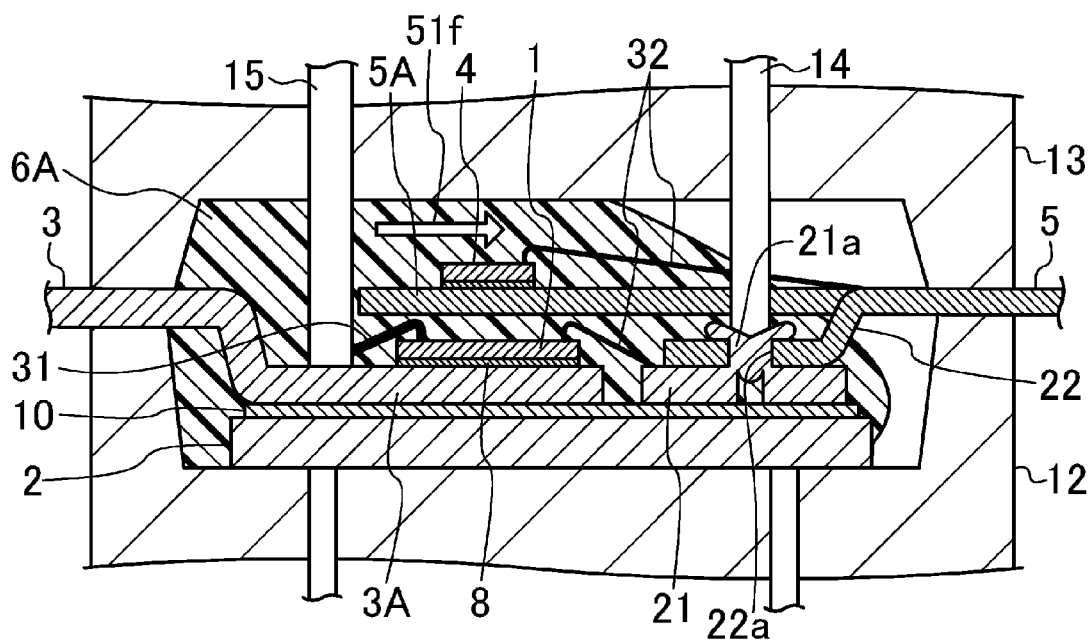
FIG. 11 is a cross-sectional view illustrating a step of the method for fabricating a resin-sealed semiconductor device according to the first embodiment.

Next, as shown in FIG. 11, a sealing resin material 6A such as epoxy, etc. is injected between the upper mold 13 and the lower mold 12 in a direction shown by an arrow 51f by transfer molding. The raised portion 21a of the power element junction lead 21 and the hole portion 22a of the control element junction lead 22 are fitted together, so that the first lead frame 3 and the second lead frame 5 are united as one. Therefore, in a sealing process, each of the first lead frame 3 and the second lead frame 5 does not flap or warp. As a result, an inconvenience that the wirings 32, etc. are cut can be avoided. Note that in the sealing process, the heat radiating plate 2 is pressed against the lower mold 12 by the second mold insert pin 15, and thus, the sealing resin material 6A does not leak out to the lower surface side of the heat radiating plate 2. Accordingly, the sealing resin material 6A does not wrap around the lower surface side of the heat radiating plate 2 after sealing with the resin. As a result, radiation of heat from the lower surface side of the heat radiating plate 2 can be effectively performed.

Figure 12:
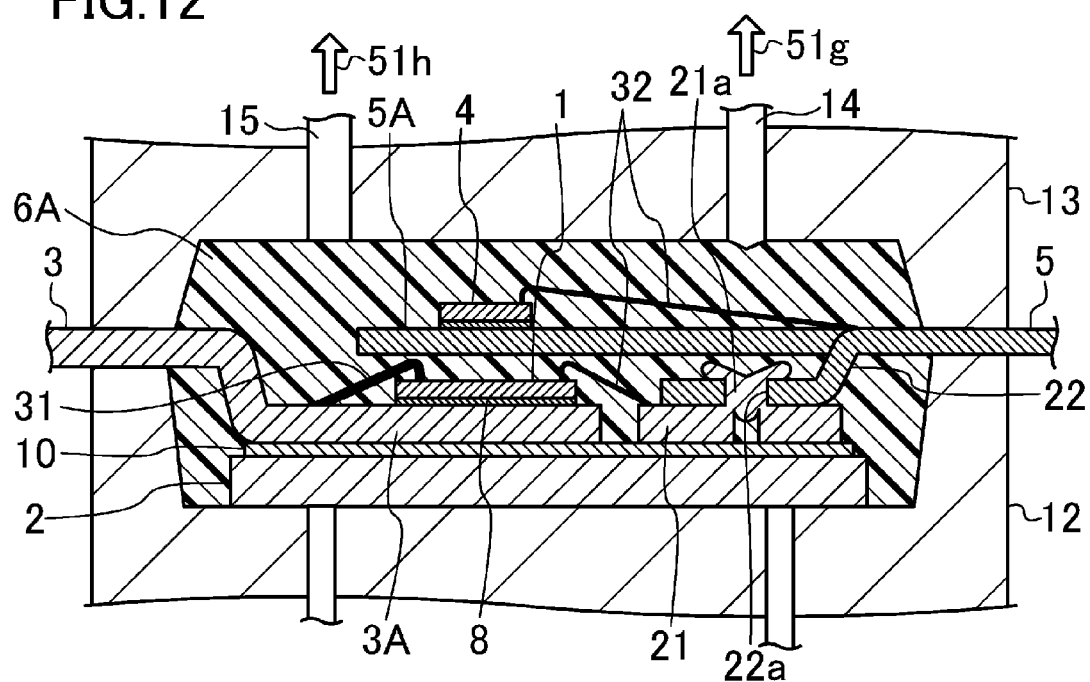
FIG. 12 is a cross-sectional view illustrating a step of the method for fabricating a resin-sealed semiconductor device according to the first embodiment.

Next, as shown in FIG. 12, the first mold insert pin 14 and the second mold insert pin 15 are moved upward in directions shown by arrows 51g and 51h, respectively, before hardening of the injected sealing resin material 6A is started. At this time, each of the first mold insert pin 14 and the second mold insert pin 15 is held at a position where the lower surface of each of the first mold insert pin 14 and the second mold insert pin 15 is flush with an internal surface of the upper mold 13 for a predetermined time. Thus, hardening of the sealing resin material 6A is facilitated by heat propagating from the lower mold 12 and the upper mold 13. At the same time, adhesion layers (not shown) forming the insulating sheet 10 provided between the first die pad 3A of the first lead frame 3 and the heat radiating plate 2 are melt and then hardened. Thus, a strong contact of the insulating sheet 10 with the lower surface of the first die pad 3A and the heat radiating plate 2 is given.

Figure 13:
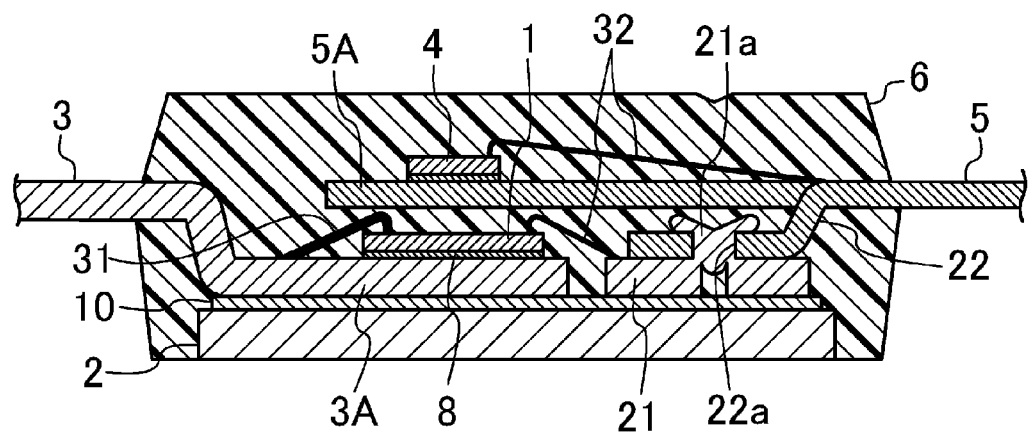
FIG. 13 is a cross-sectional view illustrating a step of the method for fabricating a resin-sealed semiconductor device according to the first embodiment.

Next, after the upper mold 13 has been moved upward, as shown in FIG. 13, the housing 6 made of the sealing resin material 6A is removed from the lower mold 12. Then, respective outer end portions of the first lead frame 3 and the second lead frame 5 project from the removed housing 6.

Thereafter, each of the first lead frame 3 and the second lead frame 5 are cut into pieces which are to serve as leads, and each of the leads is bent upward. Thus, the resin-sealed semiconductor device of FIG. 3 is obtained.

As described above, according to this embodiment, the first lead frame 3 which holds the power element 1 above the first die pad 3A and the second lead frame 5 which holds the control element 4 above the second die pad 5A overlap each other when viewed from the top. Furthermore, the second die pad 5A covers almost an entire surface of the power element 1 located under the second die pad 5A, and thus, the control element 4 held above the second die pad 5A is shielded from electromagnetic wave noise from the power element 1 by the second die pad 5A. Note that in a configuration in which the second die pad 5A covers an entire upper surface of the power element 1, the shielding effect of shielding the control element 4 from electromagnetic wave noise from the power element 1 is increased.

Also, in this embodiment, the power element junction lead 21 which is one of the plurality of leads of the first lead frame 3 and the control element junction lead 22 which is one of the plurality of leads of the second lead frame 5 are directly and electrically joined together. With this configuration, the first die pad 3A which holds the power element 1 and the second die pad 5A which holds the control element 4 can be three-dimensionally arranged to overlap each other when viewed from the top. Thus, the size of the resin-sealed semiconductor device can be greatly reduced.

Note that, in view of reducing the size of the device, and in view of shielding electromagnetic wave noise, a configuration in which the power element 1 which is a first element is held by the second die pad 5A, and the control element 4 which is a second element 2 is held by the first die pad 3A can be employed. However, in view of irradiating heat, a configuration in which the power element 1 is held by the first die pad 3A which includes the heat radiating plate 2 and a heat radiation path is preferable. That is, depending electric characteristics and physical characteristics of the first and second elements, the die pads 3A and 5A (the lead frames 3 and 5) to hold the first element and the second element may be determined Second Embodiment A resin-sealed semiconductor device according to a second embodiment will be described below with reference to FIG. 14 and FIG. 15. Note that in the second embodiment, each member also described in the first embodiment is identified by the same reference character, and the description thereof will be simplified.

Figure 14:
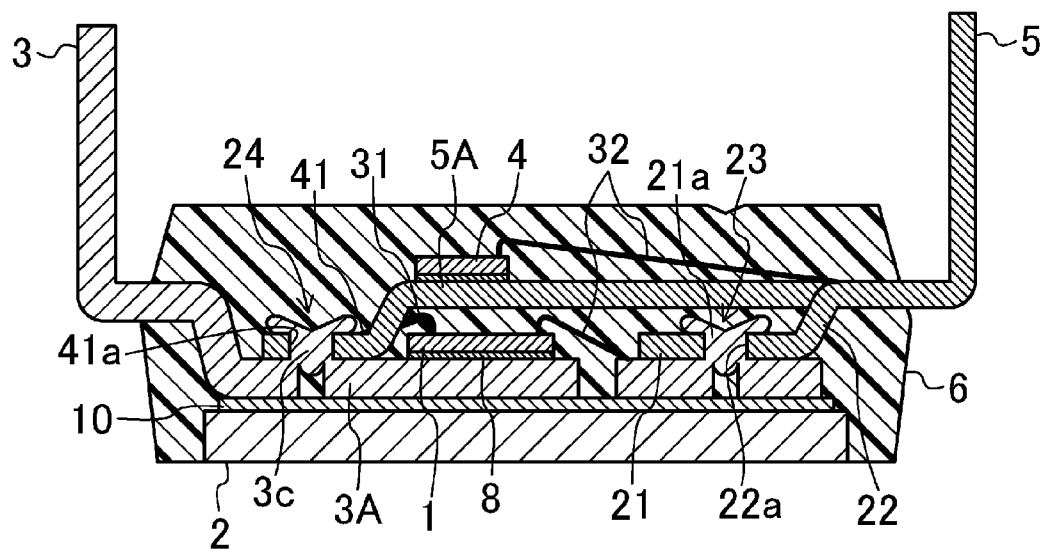
FIG. 14 is a cross-sectional view illustrating a resin-sealed semiconductor device according to a second embodiment.
Figure 15:
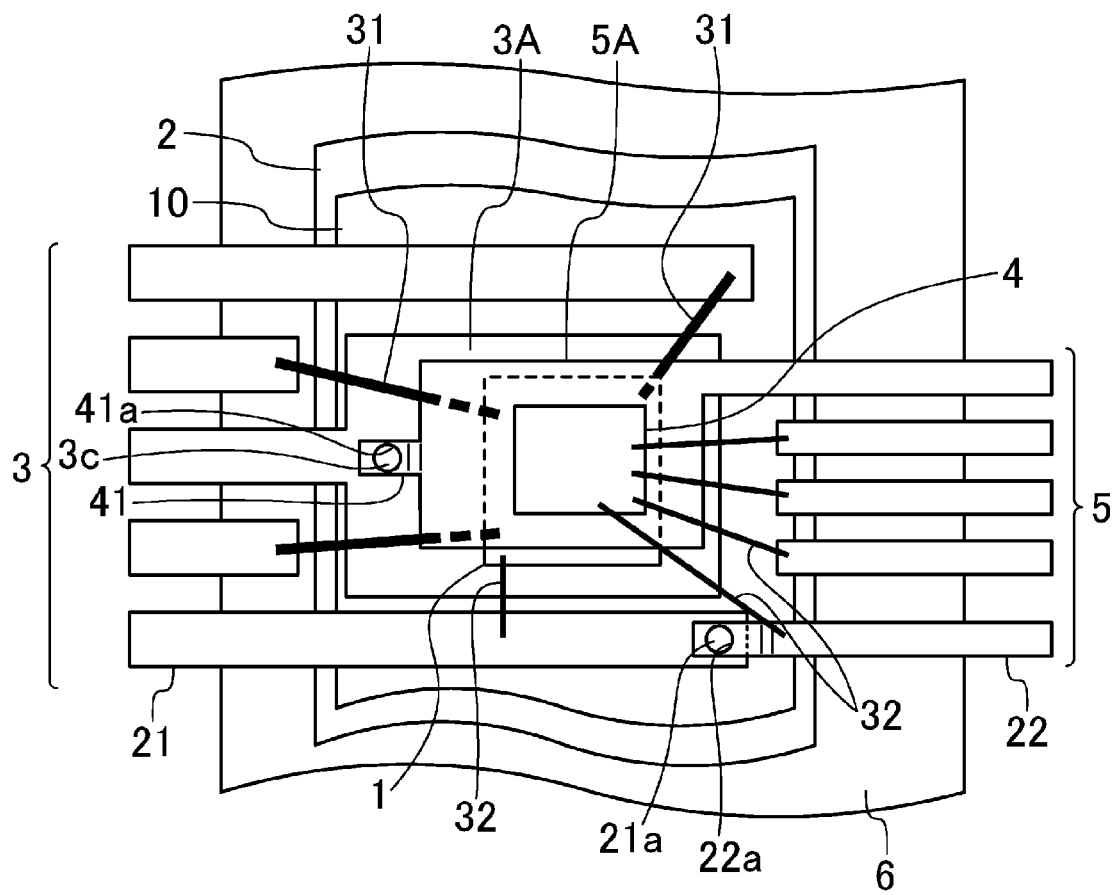
FIG. 15 is a plan view illustrating an internal configuration in the resin-sealed semiconductor device of the second embodiment.

As shown in FIG. 14 and FIG. 15, the second lead frame 5 according to this embodiment is configured so that the second die pad 5A covers over the power element 1 and a side surface of the second die pad 5A located closer to the first lead frame 3 has a protruding portion 41 which extends toward the first lead frame 3. The protruding portion 41 is bent toward the first die pad 3A of the first lead frame 3, and is joined to the first die pad 3A.

A hole portion 41a (a second hole portion) is provided at the protruding portion 41 of the second die pad 5A. Also, a raised portion 3c (a second raised portion) whose upper surface protrudes upward is formed in a peripheral portion (in vicinity of) the first die pad 3A for holding the power element 1 by bending work.

The raised portion 3c of the first die pad 3A and the hole portion 41a of the protruding portion 41 of the second die pad 5A are placed in the lower mold 12 to be opposed to each other, and a top surface of the raised portion 3c is pressed by a mold insert pin. Thus, the protruding portion 41 of the second die pad 5A and the first die pad 3A are mechanically and electrically joined together to form a joint portion 24 (a second joint portion). The joint portion 24 of this embodiment is formed in the same manner as the joint portion 23 of the first embodiment, and therefore, a detail description of a method for forming the joint portion 24 will be omitted.

Note that the raised portion 3c of the first die pad 3A may be formed simultaneously with the raised portion 21a of the power element junction lead 21 in the same bending work process. Also, the hole portion 41a of the protruding portion 41 of the second die pad 5A may be formed simultaneously with the hole portion 22a of the control element junction lead 22 in the same press work process.

Moreover, in this embodiment, the raised portion 3c is provided at the first die pad 3A itself. However, the present invention is not limited thereto. A raised portion may be provided at a lead portion (not shown) protruding from the side surface of the first die pad 3A and extending in parallel to the first die pad 3A to be joined to the hole portion 41a of the protruding portion 41 of the second die pad 5A.

As described above, according to this embodiment, the power element 1 is covered over by the second die pad 5A of the second lead frame 5. Thus, electromagnetic wave noise generated by the power element 1 is shielded by the second die pad 5A.

Furthermore, part of electromagnetic wave noise generated by the power element 1 flows through the first lead frame 3 via the second die pad 5A. Therefore, the amount of electromagnetic wave noise which reaches to the control element 4 is reduced, the occurrence of malfunction of the control element 4 is prevented or reduced, and the reliability of the operation of the control element 4 can be increased.

Third Embodiment

A resin-sealed semiconductor device according to a third embodiment will be described with reference to FIGS. 16-18. Note that, in the third embodiment, each member also described in the first and second embodiments is identified by the same reference character, and the description thereof is simplified.

Figure 16:
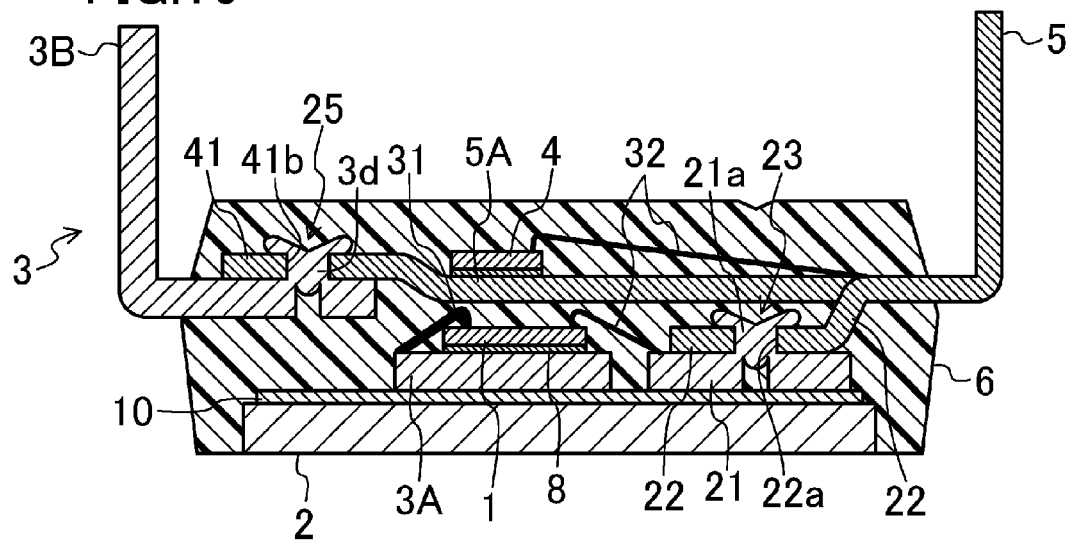
FIG. 16 is a cross-sectional view illustrating a resin-sealed semiconductor device according to a third embodiment.
Figure 17:
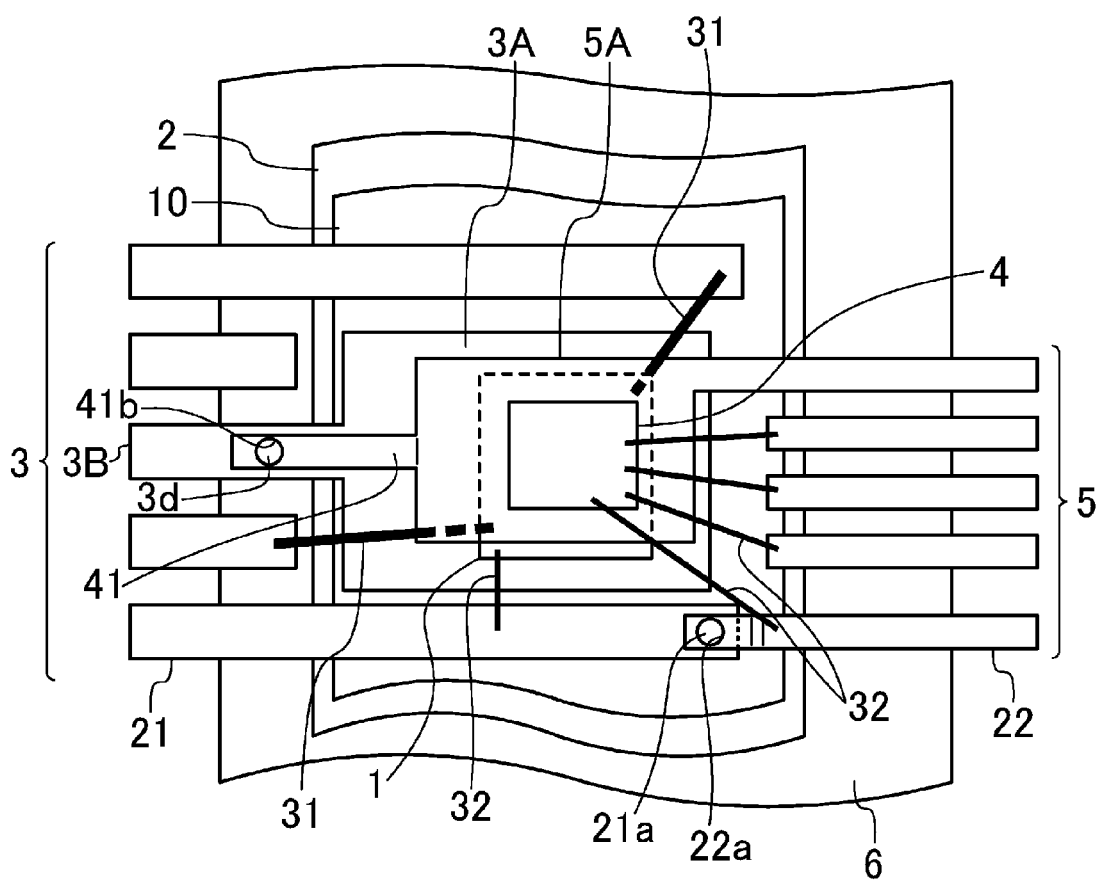
FIG. 17 is a plan view illustrating an internal configuration in the resin-sealed semiconductor device of the third embodiment.
Figure 18:
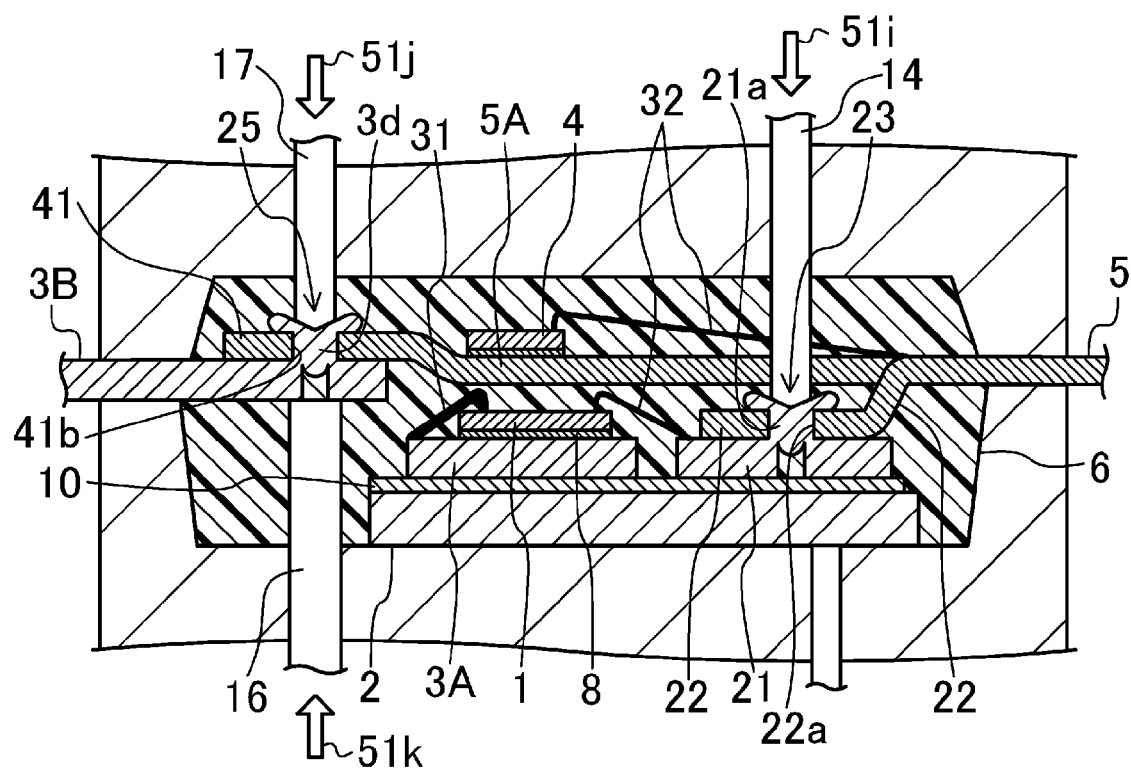
FIG. 18 is a cross-sectional view illustrating a step of a method for fabricating a resin-sealed semiconductor device according to the third embodiment.

As shown in FIG. 16 and FIG. 17, in this embodiment, a raised portion 3d (a third raised portion) forming a joint portion 25 (a third joint portion) is provided at a GND terminal lead 3B of the plurality of leads forming the first lead frame 3.

In this embodiment, the raised portion 3d provided at the GND terminal lead 3B and a hole portion 41b (a third hole portion) provided at the protruding portion 41 of the second die pad 5A form the joint portion 25. As compared to the second embodiment described above, the protruding portion 41 provided at the second die pad 5A is not bent toward the first die pad 3A, and thus, the length of a bent portion of the protruding portion 41 can be reduced. Accordingly, the area of the second die pad 5A can be increased. As a result, the power element 1 can be covered over by the second die pad 5A having a further increased area, so that the amount of electromagnetic wave noise which is generated from the power element 1 and reaches the control element 4 can be further reduced. Thus, the occurrence of malfunction of the control element 4 is prevented or reduced, and the reliability of the operation of the control element 4 can be further increased.

Note that part of the protruding portion 41 of the second die pad 5A forming the joint portion 25 is bent upward to bring an upper surface of the GND terminal lead 3B to the same height as the height of an upper surface of the second die pad 5A. Thus, respective upper surfaces of protruding portions of the first lead frame 3 and the second lead frame 5 extending laterally from the housing 6 can be made at the same height.

Major part of a method for fabricating a resin-sealed semiconductor device according to this embodiment will be described with reference to FIG. 18.

A third mold insert pin 16 is inserted in a direction of an arrow 51k to be located at a lower surface of part of the GND terminal lead 3B on which the raised portion 3d is formed. Subsequently, the raised portion 3d formed at the GND terminal lead 3B is fitted in the hole portion 41b formed in the protruding portion 41 of the second die pad 5A. Then, a fourth mold insert pin 17 is moved downward from above the hole portion 41b in a direction of an arrow 51j to squash a tip of the raised portion 3d. Thus, the GND terminal lead 3B and the second die pad 5A are mechanically and electrically joined together to form the joint portion 25.

Note that the raised portion 3d of the GND terminal lead 3B may be formed by a bending work process by which the raised portion 21a of the power element junction lead 21 is formed. Also, the hole portion 41b of the protruding portion 41 of the second die pad 5A may be formed by a press work process by which the hole portion 22a of the control element junction lead 22 is formed.

Coincidently, in each of the embodiments, the raised portion 21a of the power element junction lead 21 and the hole portion 22a of the control element junction lead 22 are joined together in a region located above the heat radiating plate 2. However, the present invention is not limited to this configuration. For example, the raised portion 21a of the power element junction lead 21 and the hole portion 22a of the control element junction lead 22 may be joined together in a region other than the region above the heat radiating plate 2 in the housing 6. Thus, the degree of freedom in designing each lead such as the power element junction leads 21 and 22, etc. can be increased.

Also, in each of the embodiments, each of the raised portion 21a, the raised portion 3c, and the raised portion 3d is formed by bending work. However, a method of processing is not limited to bending work. Specifically, any method of processing may be used as long as a raised shape is formed and, for example, half-cut work may be used. The half-cut work is processing in which, for example, stamping from a lower surface of the power element junction lead 21 using a press is stopped halfway to leave part to be stamped in a circular shape in a half-cut state before it is completely stamped, so that the circular portion is coupled to a lead.

Also, in each of the embodiments, when the joint portions 23, 24, and 25 are formed, the hole portions 22a, 41a, and 41b are formed at the control element junction lead 22 and the protruding portion 41 of the second die pad 5A. However, the present invention is not limited to a configuration in which hole portions are formed at the control element junction lead 22 and the protruding portion 41 of the second die pad 5A. For example, a recess portion may be formed in a lower surface of each of the control element junction lead 22 and the protruding portion 41 of the second die pad 5A by half-cut work or coining, etc. Also, joint which joins the recess portion to each of the raised portions 21a, 3c, and 3d is not limited to caulking press using pressing force, but the recess portion may be joined to each of the raised portions 21a, 3c, and 3d by Ag paste, etc.

INDUSTRIAL APPLICABILITY

A resin-sealed semiconductor device and a method for fabricating a resin-sealed semiconductor device according to the present invention employs a three-dimensional configuration and allows further reduction in size. Therefore, the present invention is useful for high power semiconductor devices, etc.

DESCRIPTION OF REFERENCE CHARACTERS

1 Power Element
2 Heat Radiating Plate
3 First Lead Frame
3A First Die Pad
3B GND Terminal Lead
3c Raised Portion
3d Raised Portion
4 Control Element
5 Second Lead Frame
5A Second Die Pad
6 Housing
6A Sealing Resin Material
8 Brazing Material
10 Insulating Sheet (Insulating Member)
12 Lower Mold
13 Upper Mold
14 First Mold Insert Pin
15 Second Mold Insert Pin
16 Third Mold Insert Pin
17 Fourth Mold Insert Pin
21 Power Element Junction Lead
21a Raised Portion
22 Control Element Junction Lead
22a Hole Portion
23 Joint Portion
24 Joint Portion
31 Wiring
32 Wiring
41 Protruding Portion
41a Hole Portion
41b Hole Portion

The invention claimed is:
1. A resin-sealed semiconductor device, comprising:
a first element;
a second element;

a first lead frame having a first die pad which holds the first element on an upper surface thereof, and a plurality of first leads;

a second lead frame having a second die pad which holds the second element on an upper surface thereof, and a plurality of second leads;

a housing made of a resin material and sealing the first element, the first die pad, and at least part of each of the first leads, and the second element, the second die pad, and at least part of each of the second leads; and a heat radiating plate provided to have a lower surface thereof exposed from the housing and located under the first lead frame with an insulating member interposed therebetween, wherein one or more of the first leads and one or more of the second leads are directly joined together by a first joint portion and electrically coupled together in the housing.

2. The resin-sealed semiconductor device of claim 1, wherein the one or more of the first leads and the one or more of the second leads are joined by caulking press to form the first joint portion.

3. The resin-sealed semiconductor device of claim 1, wherein a first hole portion is formed by stamping from a surface opposite to a surface holding the second element.

4. The resin-sealed semiconductor device of claim 1, wherein the at least part of the first element and the at least part of the second element overlap each other when viewed from the top.

5. The resin-sealed semiconductor device of claim 1, wherein the first joint portion is formed in a manner such that a raised portion formed at the first lead is fitted in a hole portion formed at the second lead, and a top surface of the raised portion extends around the hole portion.

6. The resin-sealed semiconductor device of claim 1, wherein a thickness of the first lead frame is greater than that of the second lead frame.

7. The resin-sealed semiconductor device of claim 1, wherein a through hole is formed at a peripheral portion of the second die pad which holds the second element.

8. The resin-sealed semiconductor device of claim 1, wherein a plated layer is formed on at least a lower surface of the second die pad.

9. The resin-sealed semiconductor device of claim 8, wherein the plated layer is made of a magnetic material.

10. The resin-sealed semiconductor device of claim 1, wherein the second lead frame has a protruding portion extending from a side surface of the second die pad, and the protruding portion of the second lead frame and the first die pad are directly joined together by a second joint portion, and electrically coupled together in the housing.

11. The resin-sealed semiconductor device of claim 1, wherein the second lead frame has a protruding portion extending from a side surface of the second die pad, and the protruding portion of the second lead frame and the first lead are directly joined together by a third joint portion, and electrically coupled together in the housing.

12. A resin-sealed semiconductor device, comprising:
a first element;
a second element;
a first lead frame having a first die pad which holds the first element on an upper surface thereof, and a plurality of first leads;

a second lead frame having a second die pad which holds the second element on an upper surface thereof, and a plurality of second leads; and a housing made of a resin material and sealing the first element, the first die pad, and at least part of each of the first leads, and the second element, the second die pad, and at least part of each of the second leads, wherein one or more of the first leads and one or more of the second leads are directly joined together by a first joint portion and electrically coupled together in the housing, a lower surface of the second die pad is higher than an upper surface of the first element, and at least part of the first die pad and at least part of the second die pad overlap each other when viewed from the top.

13. A method for fabricating a resin-sealed semiconductor device, comprising:

after forming a first raised portion at one of a plurality of first leads in a first lead frame, and a first hole portion at one of a plurality of second leads in a second lead frame in advance;

placing the first lead frame in a lower mold;

placing the second lead frame on the first frame so that the first raised portion is fitted in the first hole portion;

applying a weight to the first raised portion fitted in the first hole portion by an insert pin provided in an upper mold to directly join the first lead and the second lead together; and injecting a sealing material between the lower mold and the upper mold to form a housing made of the sealing material.

14. The method of claim 13, wherein the first raised portion is squashed, and thereby, the first lead and the second lead are joined by caulking press.

15. The method of claim 13, wherein the first hole portion is formed by stamping from a surface opposite to a surface of the second lead which holds a second element.

16. The method of claim 13, further comprising:
before the placing the first lead frame in the lower mold, placing a heat radiating plate made of a metal in the lower mold, wherein when the first lead frame is placed in the lower mold, the first lead frame is placed on the heat radiating plate with an insulating member interposed therebetween.

17. The method of claim 13, further comprising:
after forming a second hole portion at a peripheral portion of the second die pad of the second lead which holds the second element, and a second raised portion at a peripheral portion of the first die pad of the first lead which holds a first element in advance, placing the second lead frame so that the first raised portion and the second raised portion formed at the first lead are fitted respectively in the first hole portion and the second hole portion formed at the second lead, when the second lead frame is placed on the first lead frame; and applying a weight to the first raised portion and the second raised portion fitted respectively in the first hole portion and the second hole portion by a plurality of insert pins provided in the upper mold to directly join the first raised portion and the first hole portion together and the second raised portion and the second hole portion together.

18. The method of claim 17, wherein the first raised portion and the second raised portion are simultaneously formed at the first lead, and the first hole portion and the second hole portion are simultaneously formed at the second lead.

* * * * *